United States Patent
Chen et al.

(10) Patent No.: US 11,250,929 B2
(45) Date of Patent: Feb. 15, 2022

(54) SYSTEM FOR DETECTING COMPUTER STARTUP AND METHOD OF SYSTEM

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Ching-Jou Chen, New Taipei (TW); Tzu-Wei Lai, New Taipei (TW)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 333 days.

(21) Appl. No.: 16/662,199

(22) Filed: Oct. 24, 2019

(65) Prior Publication Data

US 2020/0342951 A1    Oct. 29, 2020

(30) Foreign Application Priority Data

Apr. 23, 2019  (CN) .......................... 201910329066.8

(51) Int. Cl.
| | | |
|---|---|---|
| G11C 29/44 | (2006.01) | |
| G06F 11/22 | (2006.01) | |
| G06F 13/40 | (2006.01) | |
| G06F 1/28 | (2006.01) | |
| G06F 9/4401 | (2018.01) | |
| G06F 13/16 | (2006.01) | |

(52) U.S. Cl.
CPC ............ *G11C 29/4401* (2013.01); *G06F 1/28* (2013.01); *G06F 9/4406* (2013.01); *G06F 11/2284* (2013.01); *G06F 13/1668* (2013.01); *G06F 13/4068* (2013.01)

(58) Field of Classification Search
CPC ............... G06F 9/4406; G06F 11/2284; G06F 13/4068; G06F 1/24; G06F 9/4403; G06F 11/1417; G11C 2029/0407
See application file for complete search history.

(56) References Cited

U.S. PATENT DOCUMENTS

| | | | |
|---|---|---|---|
| 2006/0020845 A1* | 1/2006 | Broyles, III ........ | G06F 11/1417 714/2 |
| 2011/0093741 A1* | 4/2011 | Liang .................. | G06F 11/1417 714/6.1 |
| 2016/0085667 A1* | 3/2016 | Huang ................ | G06F 11/1417 711/102 |

\* cited by examiner

*Primary Examiner* — Idriss N Alrobaye
*Assistant Examiner* — Ronald T Modo
(74) *Attorney, Agent, or Firm* — ScienBiziP, P.C.

(57) ABSTRACT

An arrangement to guarantee boot up of a computer includes a control center microchip with BIOS boot block and BIOS program, and a flash memory divided into a first protected block, a main block, and a second protected block. In the computer, an embedded controller (EC) with stored modules is electrically connected to the flash memory and the control center microchip. The modules include a determining module to check that the code of the first protected block is identical with the code of the second protected block and a recovery module able to reinstate correct code from the second protected block into the first protected block if required. A method applied to the disclosed computer startup detection system is also disclosed.

10 Claims, 5 Drawing Sheets

SYSTEM FOR DETECTING COMPUTER STARTUP AND METHOD OF SYSTEM

FIELD

The subject matter herein generally relates to computers and particularly to a computer startup detecting system and method.

BACKGROUND

In a computer, one power supply often provides electric power to both a platform controller hub (PCH) microchip and a flash memory carrying basic input/output system (BIOS) microchip. Thus, a management engine (ME) in the PCH microchip can firstly read codes from the flash memory to initialize a CPU and the PCH microchip, the CPU is activated, and then reads the codes from the flash memory through the PCH microchip to perform power on self test (POST) for startup. If the flash memory is damaged in some way the computer cannot be started.

Thus, two flash memories can be employed, wherein one is used as a backup flash memory, and the other is used as a normal flash memory. When the normal flash memory is damaged, the CPU is switched to the backup flash memory. After the computer is started, the codes stored in the backup flash memory can be written back to the normal flash memory. However, the two flash memories are more complex and expensive.

In another method, a protected block is in the flash memory, such protected block is reserved for a most basic booting action. Codes stored in protected block cannot be changed and the protected block cannot be overwritten after computer is started. A write-protection of the protected block can be unlocked only when the flash memory is updated. Therefore, if the CPU cannot be started next time to enter the operating system due to an erroneous overwrite, there is still a mechanism for the system to be restarted. An error block of the flash memory can be written back through the protected block. However, the write-protection of protected block being unlocked when the flash memory is updated allows possible damage to the protected block due to mistake, and that may lead to a non-bootable and unrecoverable computer.

BRIEF DESCRIPTION OF THE DRAWINGS

Many aspects of the present disclosure can be better understood with reference to the drawings. The components in the drawings are not necessarily drawn to scale, the emphasis instead being placed upon clearly illustrating the principles of the disclosure. Moreover, in the drawings, like reference numerals designate corresponding parts throughout the views.

DETAILED DESCRIPTION

Figure 1:
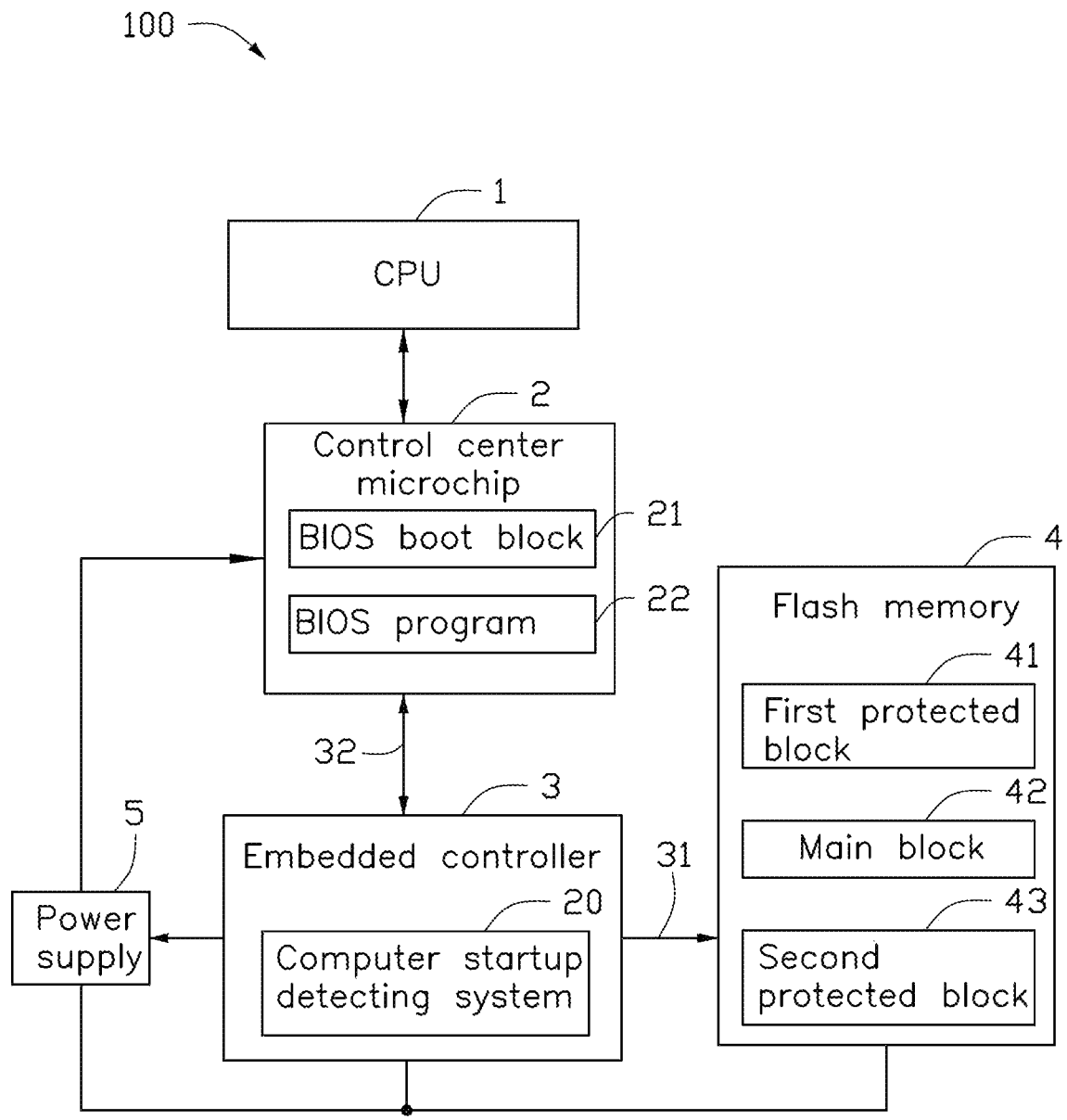
FIG. 1 is a block diagram of one embodiment of a computer including a system for detecting computer startup.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiment described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

FIG. 1 is a block diagram of one embodiment of a computer including a startup detecting system. The computer 100 includes, but is not limited to, a central processing unit (CPU) 1, a control center microchip 2, an embedded controller (EC) 3, a flash memory 4, and a power supply 5. The control center microchip 2 can be, but is not limited to, a platform controller Hub (PCH) microchip. The control center microchip 2 can also be other similar microchips, such as a fusion controller hub (FCH) microchip. The power supply 5 can be a direct current power source.

The EC 3 is electrically connected to the flash memory 4 through a serial peripheral interface or other similar bus (SPI 31), and electrically connected to the control center microchip 2 through SPI bus 32. The CPU 1 is electrically connected to the control center microchip 2. The flash memory 4 is electrically connected to the control center microchip 2 through the EC 3. The power supply 5 provides electric power to the EC 3 and flash memory 4, and provides electric power to the control center microchip 2 under control of the EC 3.

In this embodiment, the computer 100 can be a personal computer (PC), a workstation computer, a notebook, a server, or other electronic computing device.

The control center microchip 2 is configured to store a BIOS boot block 21 and a BIOS program 22. The BIOS boot block 21 is configured to operate the BIOS program 22 thereby starting the computer 100 when a power-on button of the computer 100 is pressed by a user. The BIOS program 22 is configured to perform a power on self test (POST) action on the computer 100, and then normally import an operating system (OS) to complete the entire boot process when the computer 100 is started. The EC 3 has functions of monitoring and managing various hardware of the computer 100, such as detecting and managing hard disks, printers, power supplies, displays, and related serial ports (i.e., a COM port and a serial port) and other functions.

The computer startup detecting system is stored in a memory of the EC 3, thus firmware (FW) cannot make changes through mistaken operations and non-booting problems are avoided.

The flash memory 4 is divided into a first protected block 41, a main block 42, and a second protected block 43.

The first protected block 41 is write-protected. The first protected block 41 stores codes reserved for a booting action and cannot be changed during any operation after booting. Since the first protected block 41 is write-protected during any operation after booting, a write-protect bar of the protected block 41 can be unlocked only when the flash memory 4 is updated.

The main block 42 is not write-protected. The main block 42 stores fixed codes which can include a BIOS main program, a POST program, an OS program, and other rewritable data blocks.

The second protected block 43 is write-protected. The second protected block 43 stores the same codes as are stored in the first protected block 41. The codes stored in the second protected block 43 are used as backup codes for repairing the first protected block 41. A write-protect bar of the second protected block 43 cannot be unlocked during a process of updating the first protected block 41 and the main block 42. It is only after the first protected block 41 and the main block 42 are updated and the computer 100 then started that the write-protect bar of the second protected block 43 is unlocked. Then the codes are copied from the first protected block 41 to the second protected block 43, the write-protect bar of the second protected block 43 is immediately applied and resumed as long as the copy is correctly completed.

Figure 2:
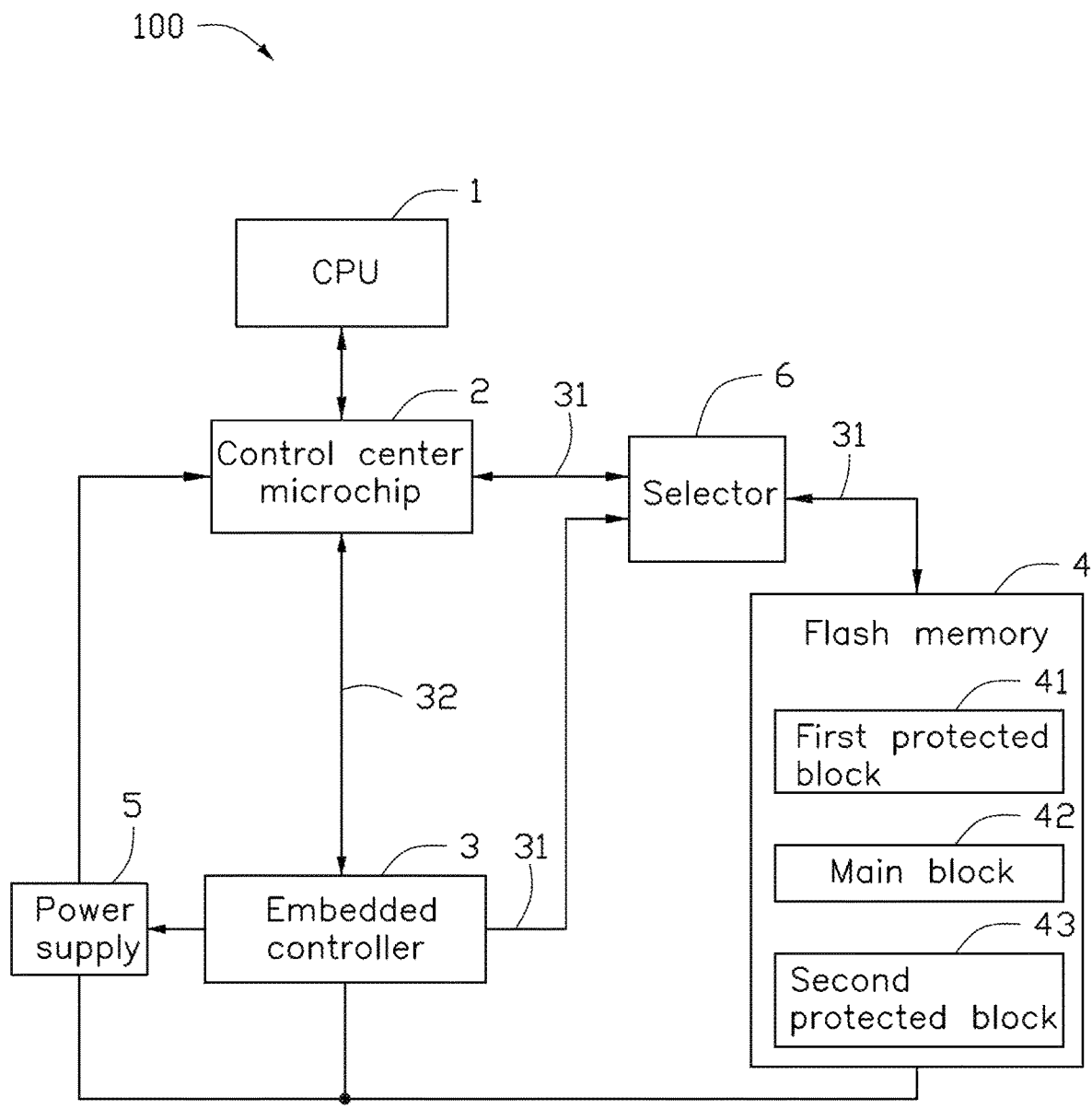
FIG. 2 is a block diagram of another embodiment of a computer including a system for detecting computer startup.

Referring to FIG. 2, in other embodiment, the computer 100 further includes a selector 6. One end of the selector 6 is selectively connected to the control center microchip 2 and the EC 3 through the SPI 31. The other end of the selector 6 is connected to the flash memory 4 through the SPI 31. The CPU 1 is electrically connected to the control center microchip 2. The flash memory 4 is electrically connected to the control center microchip 2 through the EC 3. The power supply 5 provides electric power to the EC 3 and the flash memory 4, and to the control center microchip 2 as controlled by the EC 3. The flash memory 4 is switched to the control center microchip 2 before the control center microchip 2 is powered up.

Figure 3:
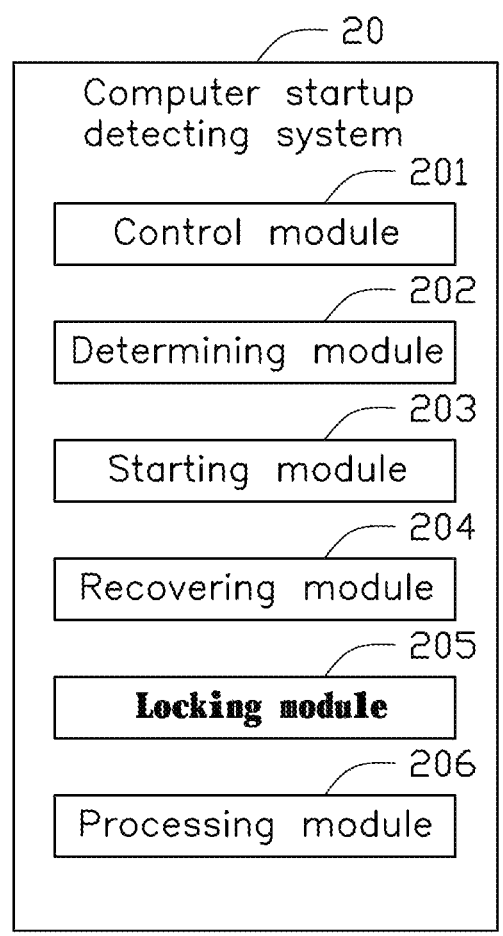
FIG. 3 is a block diagram of one embodiment of the system for detecting computer startup.

Referring to FIG. 3, in one embodiment, the computer startup detecting system 20 may include one or more modules, for example, a control module 201, a determining module 202, a starting module 203, a recovering module 204, a locking module 205, and a processing module 206. In general, the word "module", as used herein, refers to logic embodied in hardware or firmware, or to a collection of software instructions, written in a programming language, such as, Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable medium include CDs, DVDs, BLU-RAY, flash memory, and hard disk drives. In this embodiment, the modules refer to a series of program instruction segments that can be executed by the CPU 1 of the computer 100 to perform fixed functions, these are stored in the EC 3.

Figure 4:
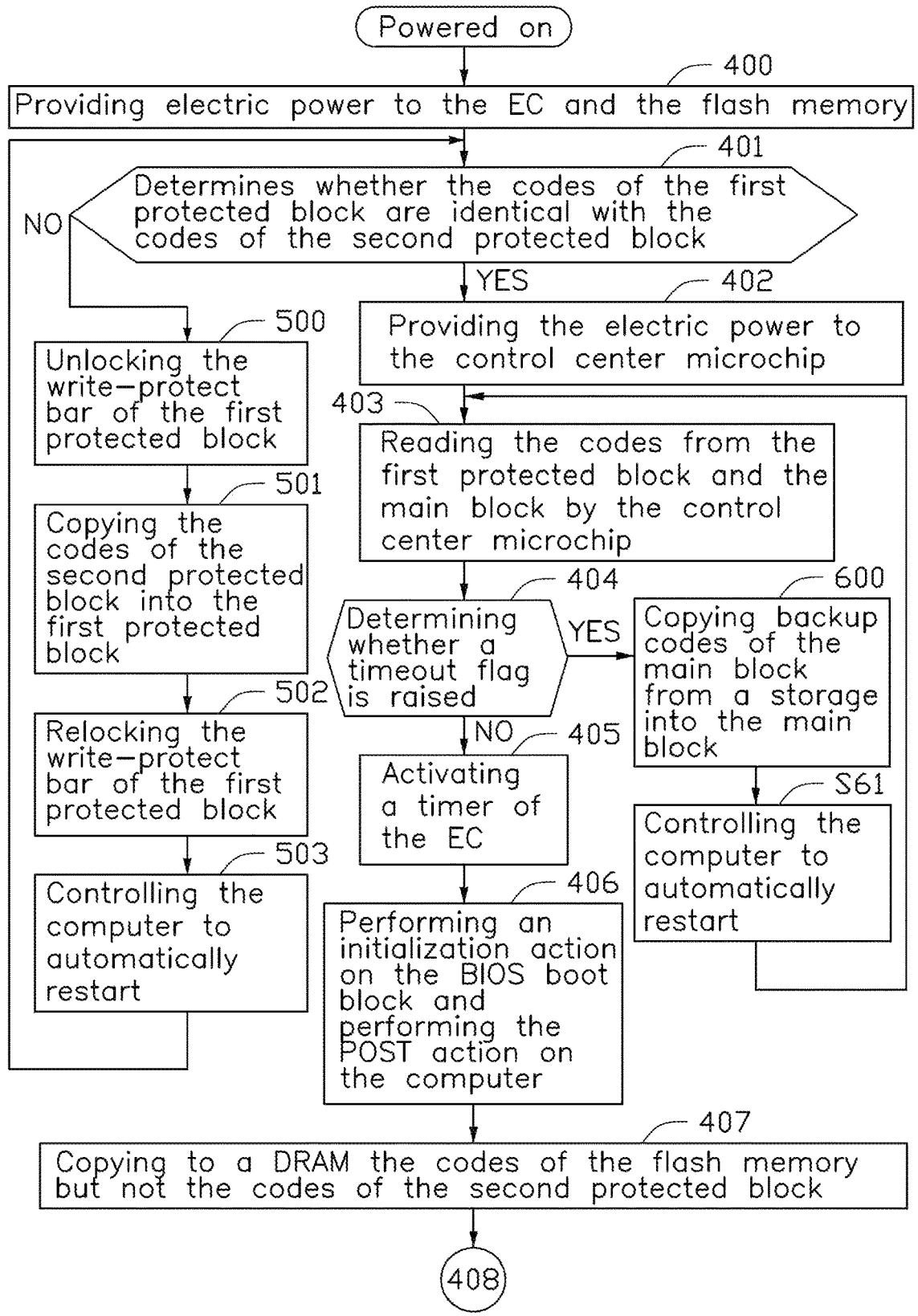
FIG. 4 and FIG. 5 are a flowchart of one embodiment of a method for detecting computer startup.
Figure 5:
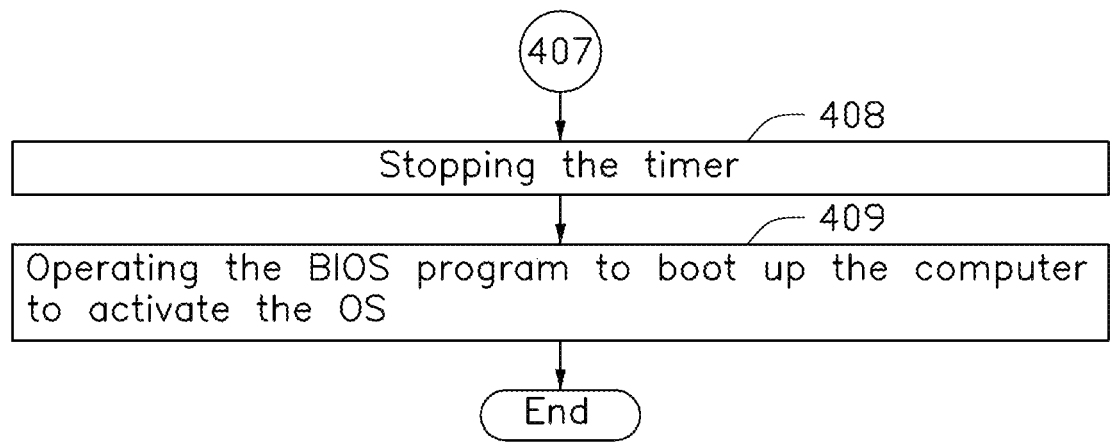

Referring to FIGS. 4 and 5, a flowchart of a method in one embodiment is illustrated. The method is provided by way of example, as there are a variety of ways to carry out the method. The method described below can be carried out using the configurations illustrated in FIG. 3, for example, and various elements of these figures are referenced in explaining example method. Each block shown in FIGS. 4 and 5 represents one or more processes, methods, or sub-routines carried out in the exemplary method. Additionally, the illustrated order of blocks is by example only and the order of the blocks can change. The exemplary method can begin at block 400.

At block 400, when the computer 100 is powered-on, the power supply 5 provides electric power to the EC 3 and the flash memory 4. The control module 201 does not electric power to the control center microchip 2, and the control center microchip 2 is in an unpowered state.

At block 401, the determining module 202 determines whether the codes of the first protected block 41 are identical with the codes of the second protected block 43. If the codes of the first protected block 41 are identical, that means the codes of the first protected block 41 are correct, and the process goes to block 402. If the codes are not identical, the codes of the first protected block 41 are in error, and the process goes to block 410.

At block 402, the control module 201 controls the power supply 5 to provide electric power to the control center microchip 2.

At block 403, the starting module 203 controls the BIOS booting block 21 of the control center microchip 2 to read the codes from the first protected block 41 and the main block 42 to perform booting of the computer 100.

At block 404, the determining module 202 determines whether a timeout flag is raised in relation to the codes in the main block 42. If no timeout flag is raised, the process goes to block 405. If the timeout flag is raised, that means the codes of the main block 42 are in error, and the process goes to block 410.

At block 405, the starting module 203 activates a timer of the EC 3.

At block 406, the starting module 203 performs initialization of the BIOS boot block 21, and the BIOS boot block 21 boots the BIOS program 22 to perform the POST action on the computer 100.

At block 407, the recovering module 204 copies to a DRAM the codes of the flash memory 4 but not the codes of the second protected block 43. In other embodiment, the block 407 can be omitted.

At block 408, the starting module 203 stops the timer of the EC 3.

At block 409, the starting module 203 operates the BIOS program to boot up the computer 100 to activate the OS.

At block 500, the locking module 205 unlocks the write-protect bar of the first protected block 41, the first protected block 41 can then be overwritten.

At block 511, the recovering module 204 copies the codes of the second protected block 43 into the first protected block 41 to repair or replace the first protected block 41.

At block 512, the locking module 205 relocks the write-protect bar of the first protected block 41.

At block 513, the processing module 206 controls the computer 100 to automatically restart, and then the process returns to block 401.

At block 600, the recovering module 204 copies backup codes of the main block 42 from a storage into the main block 42 to repair or replace the main block 42. The storage can be, for example, a Hard Disk Drive (HDD), a Solid State Drive (SSD), a USB memory, or the like.

At block 601, the processing module 206 controls the computer to automatically restart, and the process returns to block 403.

In other embodiment, the locking module 205 is further configured to lock down and unlock the write-protect bar of the second protected block 43 thereby allowing another unlocking of the write-protect bar of the second protected block 43 only when the first protected block 43 and the main block 42 are correctly updated.

The above-mentioned computer startup detecting system using the method control the power supply 5 to provide electric power to the control center chip 2 after confirming that the codes of the first protection block 41 are correct, thereby any damage or malfunction of the flash memory 4 is irrelevant in relation to booting the computer. In addition, the computer startup detecting system 20 and the method can repair the first protected block 41 by using the backup codes of second protection block 43, and repair the main block 42 by using the stored codes, thereby avoiding any adverse changes to the flash memory 4 caused by a mistake or other operation of the user, and also reducing cost.

The embodiments shown and described above are only examples. Many details are found in the relevant art, therefore many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A computer, comprising:
    a control center microchip storing a BIOS boot block and a BIOS program;
    a flash memory divided into a first protected block, a main block configured to store fixed codes, and a second protected block configured to store backup codes for repairing the first protected block, wherein the second protected block is write-protected; and
    an embedded controller (EC) electrically connected to the flash memory and the control center microchip; and
    a power supply;
    a central processing unit (CPU); and
    one or more modules that are stored in the EC and executed by the CPU, the one or more modules comprising:
    a determining module determining whether the codes of the first protected block are identical with the codes of the second protected block;
    a recovering module copying the codes of the second protected block into the first protected block to repair the first protected block when the codes of the first protected block are not identical with the codes of the second protected block;
    a control module controlling the power supply to provide electric power to the control center microchip when the codes of the first protected block are identical with the codes of the second protected block; and
    a starting module reading the codes from the first protected block and the main block by the BIOS boot block of the control center microchip, initializing the BIOS boot block, and booting the BIOS program to perform power on self test (POST) by the BIOS boot block.

2. The computer of claim 1, wherein the determining module further determines whether a timeout flag is raised in relation to the codes in the main block, the recovering module copies backup codes of the main block from a storage into the main block to repair the main block when the timeout flag is raised.

3. The computer of claim 2, further comprising a processing module, wherein the processing module is configured to control the computer to automatically restart after repairing the main block or the first protected block.

4. The computer of claim 1, wherein the starting module is further configured to operate the BIOS program to boot up the computer to activate the OS.

5. The computer of claim 1, further comprising a locking module, wherein the locking module is further configured to lock and unlock a write-protect bar of the second protected block.

6. The computer of claim 1, further comprising a selector, wherein one end of the selector is selectively connected to the control center microchip and the EC, the other end of the selector is connected to the flash memory.

7. A computer-implemented method, the computer comprising control center microchip, an embedded controller (EC), a flash memory, and a power supply, wherein the control center microchip stores a BIOS boot block and a BIOS program, the EC is electrically connected to the flash memory and the control center microchip, the flash memory is divided into a first protected block, a main block configured to store fixed codes, and a second protected block configured to store backup codes for repairing the first protected block, the second protected block is write-protected, the method comprising:
    providing electric power to the EC and the flash memory when the computer is powered-on;
    determines whether the codes of the first protected block are identical with the codes of the second protected block;
    copying the codes of the second protected block into the first protected block to repair the first protected block when the codes of the first protected block are not identical with the codes of the second protected block;
    providing the electric power to the control center microchip when the codes of the first protected block are identical with the codes of the second protected block; and
    reading the codes from the first protected block and the main block by the BIOS boot block of the control center microchip;
    initializing the BIOS boot block; and
    booting the BIOS program to perform power on self test (POST) by the BIOS boot block.

8. The method of claim 7, after "reads the codes from the first protected block and the main block", further comprising:
    determining whether a timeout flag is raised in relation to the codes in the main block; and
    copying backup codes of the main block from a storage into the main block to repair the main block when the timeout flag is raised.

9. The method of claim 8, further comprising
    controlling the computer to automatically restart after repairing the main block or the first protected block.

10. The method of claim 7, after "booting the BIOS program to perform a POST action on the computer", further comprising
    operating the BIOS program to operate the BIOS program to boot up the computer to activate the OS.

* * * * *